(12) United States Patent
Anthony

(10) Patent No.: US 7,050,326 B2
(45) Date of Patent: May 23, 2006

(54) MAGNETIC MEMORY DEVICE WITH CURRENT CARRYING REFERENCE LAYER

(75) Inventor: Thomas Anthony, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 132 days.

(21) Appl. No.: 10/680,451

(22) Filed: Oct. 7, 2003

(65) Prior Publication Data

US 2005/0073883 A1   Apr. 7, 2005

(51) Int. Cl.
*G11C 11/00*   (2006.01)

(52) U.S. Cl. ............ 365/158; 365/171; 365/173

(58) Field of Classification Search ......... 365/158, 365/171, 173
See application file for complete search history.

(56) References Cited

U.S. PATENT DOCUMENTS

| | | | |
|---|---|---|---|
| 6,169,686 B1 | 1/2001 | Brug et al. | |
| 6,172,904 B1 | 1/2001 | Anthony et al. | |
| 6,205,053 B1 | 3/2001 | Anthony | |
| 6,404,673 B1* | 6/2002 | Matsui | 365/173 |
| 6,567,297 B1* | 5/2003 | Baker | 365/148 |
| 6,689,622 B1* | 2/2004 | Drewes | 438/3 |
| 6,809,981 B1* | 10/2004 | Baker | 365/225.5 |
| 6,839,275 B1* | 1/2005 | Van Brocklin et al. | 365/173 |
| 2002/0034117 A1 | 3/2002 | Okazawa | |
| 2002/0058158 A1 | 5/2002 | Odagawa et al. | |

FOREIGN PATENT DOCUMENTS

EP   1132918   9/2001

OTHER PUBLICATIONS

The J.S. McCarthy Co., "2000 IEEE International Solid-State Circuits Conference" Digest of Technical Papers, vol. 43, 4 pgs.
Copy of European Search Report having European Application No. 04009240.5 mailed on Aug. 4, 2005.

* cited by examiner

*Primary Examiner*—Tuan T. Nguyen
*Assistant Examiner*—Hien Nguyen

(57) ABSTRACT

One embodiment of a magnetic memory cell includes a first line and a sense layer in electrical communication with the first line. A reference layer line is configured to carry a sense current received from the sense layer. The sense current flows from the first line through the sense layer and away from the memory cell via the reference layer to determine a resistive state of the memory cell.

23 Claims, 4 Drawing Sheets

MAGNETIC MEMORY DEVICE WITH CURRENT CARRYING REFERENCE LAYER

BACKGROUND OF THE INVENTION

One type of non-volatile memory known in the art relies on magnetic memory cells. These devices, known as magnetic random access memory (MRAM) devices, include an array of magnetic memory cells. The magnetic memory cells may be of different types. For example, a magnetic tunnel junction (MTJ) memory cell or a giant magnetoresistive (GMR) memory cell.

Generally, the magnetic memory cell includes a layer of magnetic film in which the magnetization is alterable and a layer of magnetic film in which the magnetization may be fixed or "pinned" in a particular direction. The magnetic film having alterable magnetization may be referred to as a sense layer or data storage layer and the magnetic film that is fixed may be referred to as a reference layer or pinned layer.

Conductive traces (commonly referred to as word lines and bit lines or collectively referred to as write lines) are routed across the array of memory cells. Word lines extend along rows of the memory cells and bit lines extend along columns of the memory cells. A memory cell stores the bit of information as an orientation of magnetization at each intersection of a word line and a bit line. The orientation of magnetization in the sense layer aligns along an axis of the sense layer that is commonly referred to as its easy axis. Magnetic fields are applied to flip the orientation of magnetization in the sense layer along its easy axis to either a parallel or anti-parallel orientation with respect to the orientation of magnetization in the reference layer.

The orientation of magnetization of each memory cell will assume one of two stable orientations at any given time. These two stable orientations, parallel and anti-parallel, represent logical values of "1" and "0". The orientation of magnetization of a selected memory cell may be changed by supplying current to a word line and a bit line crossing the selected memory cell. The currents create magnetic fields that, when combined, switch the orientation of magnetization of the selected memory cell from parallel to anti-parallel or vice versa.

The resistance of the memory cell differs according to the parallel or anti-parallel orientation of magnetization. When the orientation is anti-parallel, i.e., the logic "0" state, the resistance of the memory cell is at its highest. The resistance of the memory cell is at its lowest when the orientation is parallel, i.e., the logic "1" state. As a consequence, the logic state of the data bit stored in the memory cell can be determined by measuring its resistance.

In one configuration, conductive traces (commonly referred to as sense conductors) are routed across the array of memory cells. These sense conductors extend along rows of the memory cells and are electrically coupled to the reference layers of the memory cells. The bit lines, which extend along columns of the memory cells, are electrically coupled to the sense layers of the memory cells. A memory cell is situated at each intersection of a sense conductor and a bit line.

In operation, a read circuit for sensing the resistance of a memory cell is electrically coupled to each sense conductor and bit line. The read circuit selects one sense conductor and one bit line to determine the resistance and state of a particular memory cell. In one configuration, the read circuit supplies a sense current that flows through the bit line and memory cell stack to sense conductor, and back to the read circuit, where a voltage is detected. This voltage is used to determine the resistance and state of memory cell.

A write circuit for writing the state of each memory cell is electrically coupled to each word line and bit line. During a write operation, the write circuit selects one word line and one bit line to set the orientation of magnetization in the sense layer of the memory cell at the cross point of the selected bit line and word line. The orientation of magnetization in the sense layer of the selected memory cell is rotated in response to currents on the selected bit line and word line. These currents generate magnetic fields according to the right hand rule, which act in combination to rotate the orientation of magnetization in the sense layer. A larger current in a write line produces a stronger magnetic field around the write line. This magnetic field drops off in strength with increasing distance from the write line.

The magnetic field present at the sense layer is a strong function of the spacing between the sense layer and the write lines. The greater the distance between the sense layer and the write line, the larger the current must be to maintain the same magnetic field strength in the sense layer. However, larger currents and resulting stronger magnetic fields may affect the state of adjacent memory cells in the array of memory cells. Additionally, larger currents may cause electro-migration problems in the write lines, and larger currents also require using bigger drive transistors, which consume valuable space on the magnetic memory device. Larger currents and stronger magnetic fields are not always a viable option for increasing magnetic field strength to write a memory cell.

SUMMARY OF THE INVENTION

One embodiment of a magnetic memory cell includes a first line and a sense layer in electrical communication with the first line. A reference layer line is configured to carry a sense current received from the sense layer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
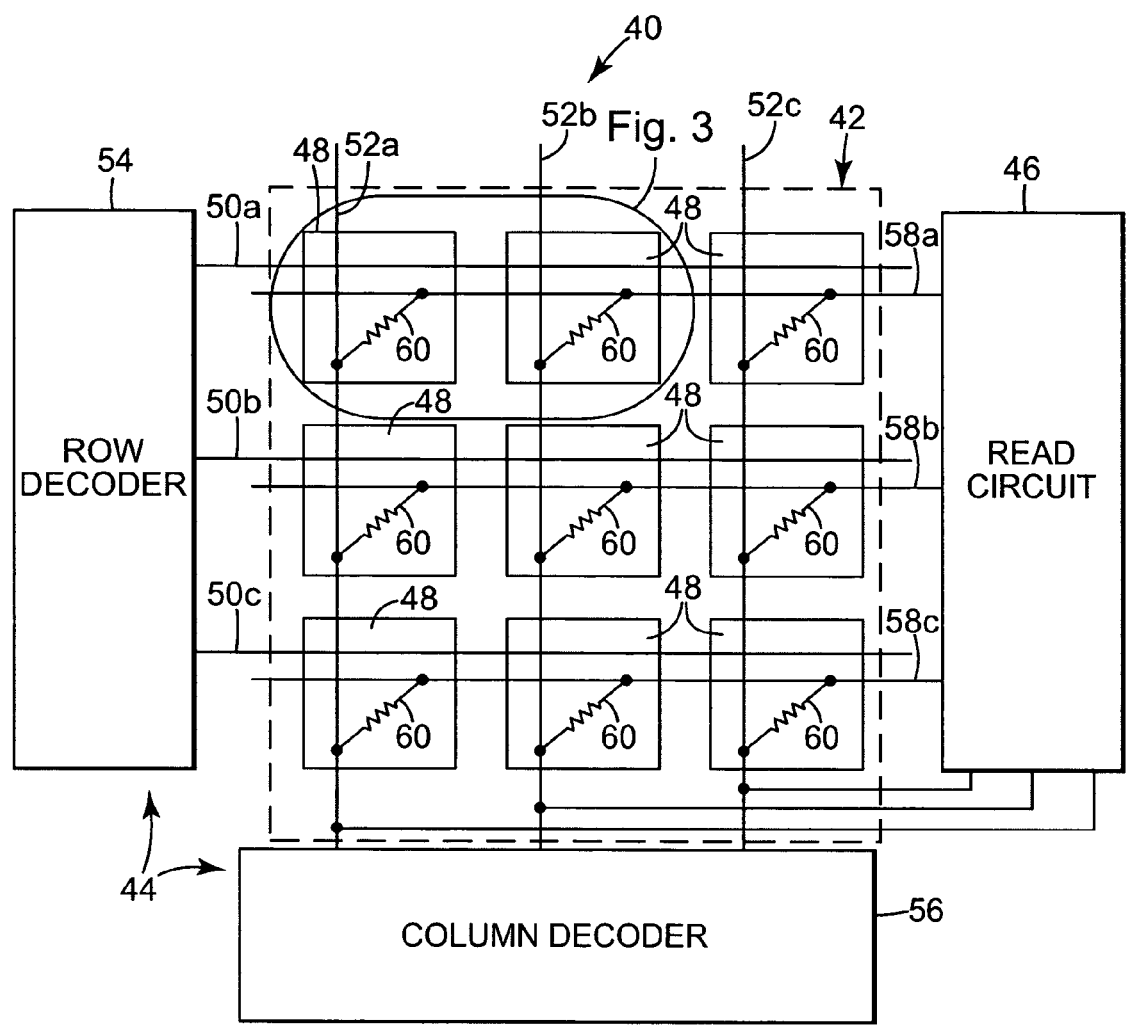
FIG. 1 is a block diagram illustrating one exemplary embodiment of a magnetic memory device, according to the present invention.

FIG. 1 is a block diagram illustrating one exemplary embodiment of a magnetic memory device 40, according to the present invention. The magnetic memory device 40 includes a magnetic memory cell array 42 electrically coupled to a write circuit 44 and a read circuit 46. The exemplary embodiment of a magnetic memory cell, indicated at 48 and described herein, has a write conductor positioned in closer proximity to a sense layer. This makes it possible to present a stronger magnetic field at the sense layer, without increasing the write current. The exemplary embodiment of the magnetic memory cell 48 is accomplished by removing a sense conductor from the memory cell. This brings one write conductor closer to the sense layer. In this configuration, the same write current can be provided through the write conductor to generate an increased magnetic field at the sense layer. This increased magnetic field combines with a second magnetic field to switch the magnetic orientation of the sense layer. The sense current for sensing the resistance and state of the memory cell 48 propagates out of the memory cell 48 through the reference layer instead of the removed sense conductor.

Magnetic memory cell array 42 includes a plurality of magnetic memory cells 48. The memory cells 48 are arranged in rows and columns, with the rows extending along an x-direction and the columns extending along a y-direction. Only a relatively small number of memory cells 48 are shown to simplify the illustration of the magnetic memory device 40. In practice, arrays of many different sizes can be used.

First lines, which are bit lines 52*a–c* extend along the y-direction in a plane on one side of the array 42. Second lines, which are word lines 50*a–c* extend along the x-direction in a plane on an opposing side of the array 42. There is one word line 50*a–c* for each row of the array 42, and one bit line 52*a–c* for each column of the array 42. Each memory cell 48 is located at a cross point of a word line 50*a–c* and a bit line 52*a–c*. In one aspect, word lines 50*a–c* and bit lines 52*a–c* are in the form of conductive traces.

The write circuit 44 includes a row decoder 54 for selecting word lines 50*a–c*, and a column decoder 56 for selecting bit lines 52*a–c* during a write operation. The write circuit 44 also supplies write currents to the selected word line 50*a–c* and bit line 52*a–c*, during a write operation.

The read circuit 46 is for sensing the resistance of a selected memory cell 48 during a read operation. The sensed resistance is representative of the information stored at the memory cell 48. Reference layer lines 58*a–c* extend along the x-direction in a plane on one side of the array 42 and are electrically coupled to the read circuit 46. Bit lines 52*a–c* extend along the y-direction in a plane on an opposing side of the array 42 and are also electrically coupled to the read circuit 46. There is one reference layer line 58*a–c* for each row of the array 42 and one bit line 52*a–c* for each column of the array 42. Each memory cell 48 is located at a cross point of a reference layer line 58*a–c* and a bit line 52*a–c*.

In another exemplary embodiment, each magnetic memory cell has its own independent reference layer line. This reference layer line is tied to an isolation transistor, which is turned on to sense the resistance in the magnetic memory cell. In other embodiments, one reference layer line can be tied to two or more magnetic memory cells.

In the present described embodiment, each reference layer line 58*a–c* extends across the memory cells 48 in one row of array 42. During a read operation, the read circuit 46 selects a reference layer line 58*a–c* and a bit line 52*a–c* for sensing the resistance 60 of the memory cell 48 that lies at the cross point of the selected reference layer line 58*a–c* and bit line 52*a–c*. The use of a reference layer line 58*a–c* to carry a sense current for determining the state of a memory cell 48 is described in detail in this application. A separate sense conductor is no longer required to carry the sense current for determining the state of a memory cell 48.

Figure 2:
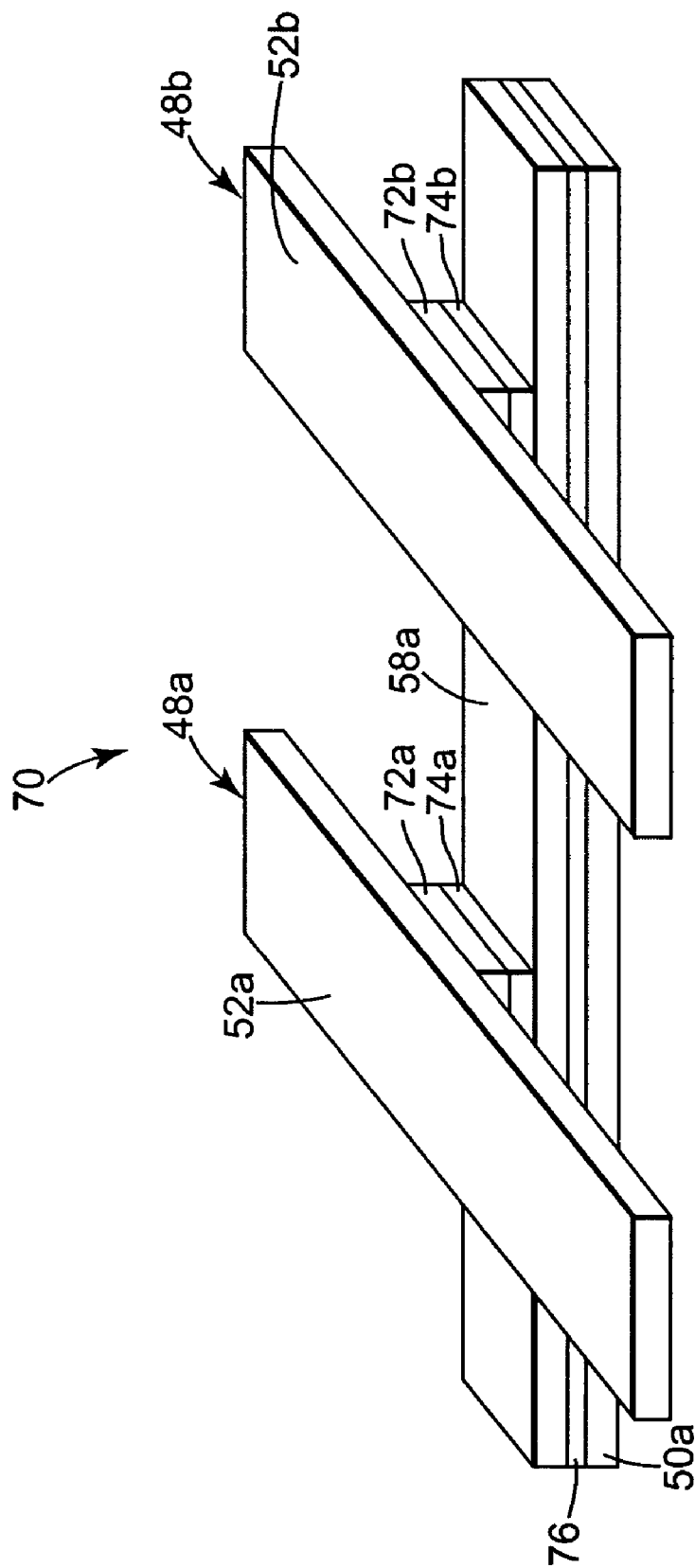
FIG. 2 is a perspective view illustrating one exemplary embodiment of two magnetic memory cells, according to the present invention.
Figure 3:
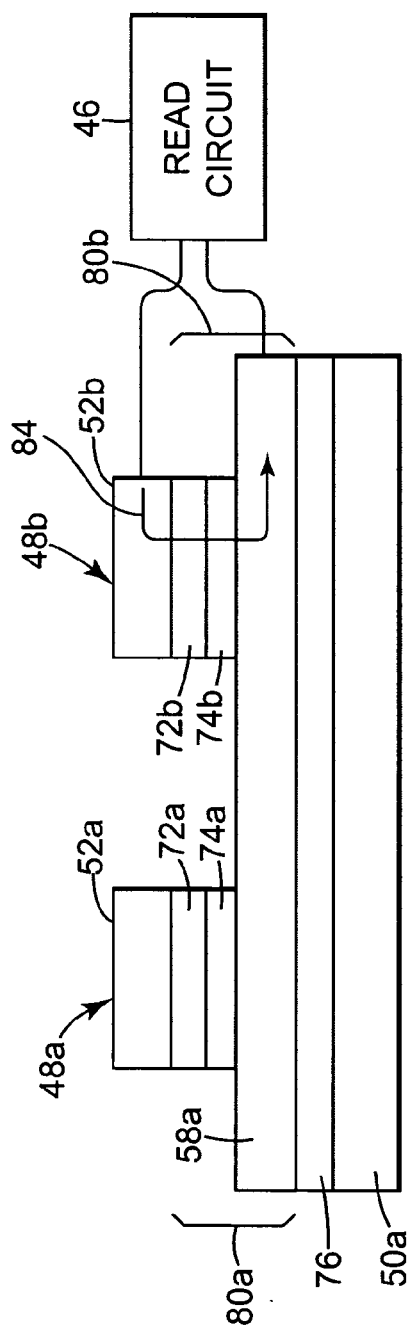
FIG. 3 is a cross section illustrating one exemplary embodiment of two magnetic memory cells and a read circuit, according to the present invention.
Figure 4:
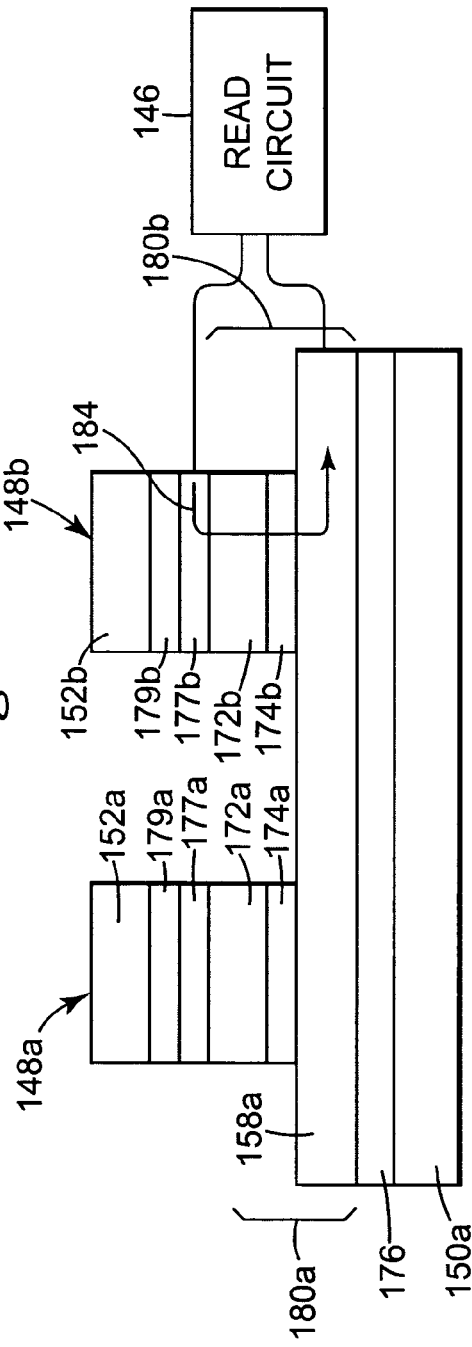
FIG. 4 is a cross section illustrating another exemplary embodiment of two magnetic memory cells and a read circuit, according to the present invention.

FIGS. 2–4 illustrate in further detail a memory cell having a reference layer line configured to carry a sense current for determining the state of the cell, according to the present invention. FIG. 2 is a diagram illustrating an exemplary embodiment of an array section, indicated at 70. Array section 70 includes two magnetic memory cells, indicated at 48*a* and 48*b*. Memory cells 48*a* and 48*b* include first lines, which are bit lines 52*a* and 52*b*, and a second line, which is word line 50*a*. Memory cells 48*a* and 48*b* include reference layer line 58*a*, isolation layer 76 and word line 50*a*. Isolation layer 76 is located between reference layer line 58*a* and word line 50*a*.

Memory cell 48*a* includes bit line 52*a*, sense layer 72*a*, barrier layer 74*a*, reference layer line 58*a*, isolation layer 76 and word line 50*a*. Barrier layer 74*a* is located between sense layer 72*a* and reference layer line 58*a*. Sense layer 72*a* is electrically coupled to bit line 52*a*. Memory cell 48*b* includes bit line 52*b*, sense layer 72*b*, barrier layer 74*b*, reference layer line 58*a*, isolation layer 76 and word line 50*a*. Barrier layer 74*b* is located between sense layer 72*b* and reference layer line 58*a*. Sense layer 72*b* is electrically coupled to bit line 52*b*.

In the present described embodiment, reference layer line 58*a* and word line 50*a* have similar patterns, however in other embodiments reference layer line 58*a* and word line 50*a* do not have similar patterns. In one aspect, isolation layer 76 is a sheet film insulating layer and in other embodiments, isolation layer 76 can be patterned. Also, bit lines 52*a* and 52*b* are illustrated as essentially orthogonal to word line 50*a*. However, bit lines 52*a* and 52*b* may lie in other angular relations to word line 50*a*.

FIG. 3 is a cross section diagram illustrating one exemplary embodiment of the two magnetic memory cells 48*a* and 48*b* with read circuit 46. Memory cells 48*a* and 48*b* include memory cell stacks 80*a* and 80*b* located between isolation layer 76 and bit lines 52*a* and 52*b*, respectively. Isolation layer 76 is located between reference layer line 58*a* and word line 50*a*.

Memory cell stack 80*a* includes sense layer 72*a*, barrier layer 74*a* and reference layer line 58*a*. Barrier layer 74*a* is located between sense layer 72*a* and reference layer line 58*a*. Sense layer 72*a* is located next to bit line 52*a*, and reference layer line 58*a* is located next to isolation layer 76. Memory cell stack 80*b* includes sense layer 72*b*, barrier layer 74*b* and reference layer line 58*a*. Barrier layer 74*b* is located between sense layer 72*b* and reference layer line 58*a*. Sense layer 72*b* is located next to bit line 52*b*, and isolation layer 76 is next to reference layer line 58*a*. Reference layer line 58*a* is electrically coupled to both memory cells 48*a* and 48*b*. In other embodiments, each reference layer line is electrically coupled to only one memory cell and an isolation transistor, which is selectively activated (i.e., turned on) to read the memory cell.

In the present embodiment, there is not a sense conductor between the reference layer line 58*a* and isolation layer 76. Reference layer line 58*a* serves as the sense conductor. Removing the sense conductor brings word line 50*a* closer to sense layers 72*a* and 72*b*.

Although, bit lines 52*a* and 52*b* and sense layers 72*a* and 72*b* are illustrated as above reference layer line 58*a* and word line 50*a*, in another embodiment, word line 50*a* and reference layer line 58*a* can be above the sense layers 72*a* and 72*b* and bit lines 52*a* and 52*b*. Also in another embodiment, word lines 50*a–c* and bit lines 52*a–c* can be switched, such that word lines 50a–c are near sense layers 72a and 72b, and bit lines 52a–c are near reference layer lines 58a–c.

In the present described embodiment, bit lines 52a and 52b are next to sense layers 72a and 72b, which have an alterable orientation of magnetization. The reference layer line 58a has a pinned orientation of magnetization. In other embodiments, the sense layers 72a and 72b and the reference layer line 58a both may be alterable.

During a read operation of memory cell 48b, reference layer line 58a and bit line 52b are coupled to read circuit 46 for sensing the resistance and state of memory cell 48b. A sense current 84 flows from read circuit 46 to bit line 52b and through sense layer 72b and barrier layer 74b. Reference layer line 58a is configured to carry sense current 84. Sense current 84 passes to reference layer line 58a and out of memory cell 48b to read circuit 46. In another embodiment, the sense current can flow in a different direction. The read circuit 46 provides a constant sense current and detects the voltage magnitude between bit line 52b and reference layer line 58a. This voltage is directly proportional to the resistance of memory cell 48b. In this manner, the resistance or state of the memory cell 48b is determined. In a different embodiment the read circuit may employ a different method of reading the memory cell 48b, such as providing a constant voltage and detecting the difference in sense current magnitudes for determining different states of the memory cell 48b. Circuits and methods for sensing the resistance and state of memory cells 48 are disclosed and described in U.S. Pat. No. 6,259,644, issued Jul. 10, 2001, entitled Equipotential Sense Methods For Resistive Cross Point Memory Cell Arrays, incorporated herein by reference.

During a write operation for writing the memory cell 48b, word line 50a and bit line 52b are coupled to write circuit 44. Write currents are provided through bit line 52b and word line 50a to generate magnetic fields according to the right hand rule around the bit line 52b and word line 50a. With the sense conductor removed from between the reference layer line 58a and isolation layer 76, word line 50a is closer to sense layer 72b. This increases the strength of the magnetic field from word line 50a in sense layer 72b using the same write current. The magnetic fields set the orientation of magnetization of the sense layer 72b to parallel or anti-parallel, relative to the orientation of magnetization in the reference layer line 58a. These two stable states, parallel and anti-parallel, present different resistance values during a read operation and represent logical values of "1" and "0". In one configuration, a higher detected resistance value represents a logical "0" state, and a lower detected resistance value represents a logical "1" state.

Reference layer lines 58a–c are made of a ferromagnetic film or a multi-layer stack of material including two or more layers of ferromagnetic material, where each pair of magnetic layers are separated by a layer of non-magnetic material. Suitable exemplary materials for the non-magnetic layers include Ru, Re, Os, Cu or Cr, or alloys of these materials. Suitable exemplary materials for reference layer lines 58a–c as a ferromagnetic film include NiFe or CoFe. Suitable exemplary multi-layer stacks include CoFe/Ru/CoFe or Co/Cu/Co. Additionally, these could be coupled to an anti-ferromagnetic material such as IrMn, PtMn, CrPtMn or NiMn, resulting in stacks such as NiFe/IrMn or CoFe/Ru/CoFe/IrMn. Further examples and descriptions of suitable reference layer lines 58a–c are disclosed in U.S. patent application Ser. No. 10/283559 entitled "Magnetic Memory Device And Methods For Making Same." This application is incorporated herein by reference. Reference layer lines 58a–c may further include thin seed layers such as Ta, Ru, Ta/Ru, or Ta/NiFe. Such seed layers establish preferred crystallographic texture in reference layer lines 58a–c. An example of a reference layer line 58a–c with a seed layer is NiFe/IrMn/Ru/Ta, where Ta is the first layer deposited in the film stack. The preferred thickness range for the seed layer is 1–10 nm. It will be apparent to one skilled in the art after reading this application that other suitable materials may be used for reference layer lines 58a–c.

Suitable exemplary materials for sense layers 72a and 72b include NiFe, CoFe or CoFeB and alloys of these. Suitable exemplary materials for barrier layers 74a and 74b include AlO or AlN. Suitable exemplary materials for isolation layer 76 include SiN, SiO or SiON. Word lines and bit lines 50a–c and 52a–c are made of conductive trace material, such as copper. It will be apparent to one skilled in the art that other suitable materials may be used for memory cell stacks 80a and 80b after reading this application.

FIG. 4 is a cross section illustrating another exemplary embodiment of two magnetic memory cells 148a and 148b with a read circuit 146. Memory cells 148a and 148b include memory cell stacks 180a and 180b located between isolation layer 176 and, in this embodiment, first lines that are sense conductors 177a and 177b, respectively. Second isolation layers 179a and 179b are located between sense conductors 177a and 177b and third lines that are bit lines 152a and 152b, respectively. Isolation layer 176 is located between reference layer line 158a and, in this embodiment, a second line that is word line 150a.

Memory cell stack 180a includes sense layer 172a, barrier layer 174a and reference layer line 158a. Barrier layer 174a is located between sense layer 172a and reference layer line 158a. Sense layer 172a is located next to sense conductor 177a, and reference layer line 158a is located next to isolation layer 176. Memory cell stack 180b includes sense layer 172b, barrier layer 174b and reference layer line 158a. Barrier layer 174b is located between sense layer 172b and reference layer line 158a. Sense layer 172b is located next to sense conductor 177b, and isolation layer 176 is located next to reference layer line 158a. Reference layer line 158a is electrically coupled to both memory cells 148a and 148b. In other embodiments, each reference layer line is electrically coupled to only one memory cell and an isolation transistor, which is turned on to read the memory cell.

In the present embodiment, there is not a sense conductor between the reference layer line 158a and isolation layer 176. Reference layer line 158a serves as the sense conductor. Removing the sense conductor brings word line 150a closer to sense layers 172a and 172b.

Reference layer line 158a and word line 150a have similar patterns. However, in other embodiments reference layer line 158a and word line 150a do not have similar patterns. Also, isolation layer 176 is a sheet film insulating layer and in other embodiments isolation layer 176 can be patterned. Sense layers 172a and 172b have an alterable orientation of magnetization and reference layer line 158a has a pinned orientation of magnetization. In other embodiments, the sense layers 172a and 172b and the reference layer line 158a may both be alterable.

Although bit lines 152a and 152b and memory cell layers through sense layers 172a and 172b are illustrated as above reference layer line 158a, isolation layer 176 and word line 150a, in another embodiment word line 150a, isolation layer 176 and reference layer line 158a can be above sense layers 172a and 172b and other memory cell layers through bit lines 152a and 152b. Also, in another embodiment, word lines such as 150a, and bit lines such as 152a and 152b can be switched so word lines 150a are near sense layers 172a and 172b and bit lines 152a and 152b are near reference layer lines such as 158a.

In the present described embodiment, reference layer line 158a and sense conductors 177a and 177b are electrically coupled to read circuit 146 for reading memory cells 148a and 148b. Word line 150a and bit lines 152a and 152b are electrically coupled to a write circuit (not shown) for writing memory cells 148a and 148b. Word line 150a and bit lines 152a and 152b are isolated from sense layers 172a and 172b and reference layer line 158a. In other words, a read operation is electrically isolated from a write operation. Read operations and write operations can occur simultaneously or at different times.

In one example read operation of memory cell 148b, reference layer line 158a and sense conductor 177b are coupled to read circuit 146 for sensing the resistance and state of memory cell 148b. A sense current 184 flows from read circuit 146 to sense conductor 177b and through sense layer 172b and barrier layer 174b. Reference layer line 158a is configured to carry sense current 184. Sense current 184 passes to reference layer line 158a and out of memory cell 148b to read circuit 146. In another embodiment, the sense current can flow in a different direction. The read circuit 146 provides a constant sense current and detects the voltage magnitude between sense conductor 177b and reference layer line 158a. This voltage is directly proportional to the resistance of memory cell 148b. In this manner, the resistance and state of the memory cell 148b is determined. In a different embodiment, the read circuit can employ a different method of reading the memory cell 148b, such as providing a constant voltage and detecting the difference in sense current magnitudes for determining different states of the memory cell 148b. Circuits and methods for sensing the resistance and state of memory cell 148b are disclosed and described in U.S. Pat. No. 6,259,644, issued Jul. 10, 2001, entitled Equipotential Sense Methods For Resistive Cross Point Memory Cell Arrays, incorporated herein by reference.

During a write operation for writing the memory cell 148b, word line 150a and bit line 152b are coupled to a write circuit. Write currents are provided through bit line 152b and word line 150a to generate magnetic fields according to the right hand rule around the bit line 152b and word line 150a. With the sense conductor removed from between the reference layer line 158a and isolation layer 176, word line 150a is closer to sense layer 172b. This increases the strength of the magnetic field from word line 150a in sense layer 172b using the same write current. The magnetic fields set the orientation of magnetization of the sense layer 172b to parallel or anti-parallel, relative to the orientation of magnetization in the reference layer line 158a. These two stable states, parallel and anti-parallel, present different resistance values during a read operation and represent logical values of "1" and "0". In one configuration, a higher detected resistance value represents a logical "0" state, and a lower detected resistance value represents a logical "1" state.

Reference layer line 158a is made of a ferromagnetic film or a multi-layer stack of material including two or more layers of ferromagnetic material. Suitable exemplary materials for reference layer line 158a as a ferromagnetic film include NiFe or CoFe. Suitable exemplary multi-layer stacks include CoFe/Ru/CoFe or Co/Cu/Co. Additionally, these could be coupled to an anti-ferromagnetic material such as IrMn, PtMn, CrPtMn or NiMn, resulting in stacks such as NiFe/IrMn or CoFe/Ru/CoFe/IrMn. Further examples and descriptions of suitable reference layer line 158a are disclosed in U.S. patent application Ser. No. 10/283559 entitled "Magnetic Memory Device And Methods For Making Same", previously incorporated herein by reference. Reference layer line 158a can further include thin seed layers such as Ta, Ru, Ta/Ru, or Ta/NiFe. Such seed layers establish preferred crystallographic texture in reference layer line 158a. An example of a reference layer line 158a with a seed layer is NiFe/IrMn/Ru/Ta, where Ta is the first layer deposited in the film stack. The preferred thickness range for the seed layer is 1–10 nm. It will be apparent to one skilled in the art after reading this application that other suitable materials may be used for reference layer line 158a.

Suitable exemplary materials for sense layers 172a and 172b include NiFe, CoFe or CoFeB and alloys of these. Suitable exemplary materials for barrier layers 174a and 174b include AlO or AlN. Suitable exemplary materials for isolation layer 176 and second isolation layers 179a and 179b include SiN, SiO or SiON. Suitable exemplary materials for sense conductors 177a and 177b include Ta, W, Al or Cu, and word lines and bit lines 150a and 152a–b are made of conductive trace material, such as copper. It will be apparent to one skilled in the art that other suitable materials may be used for memory cell stacks 180a and 180b after reading this application.

Figure 5:
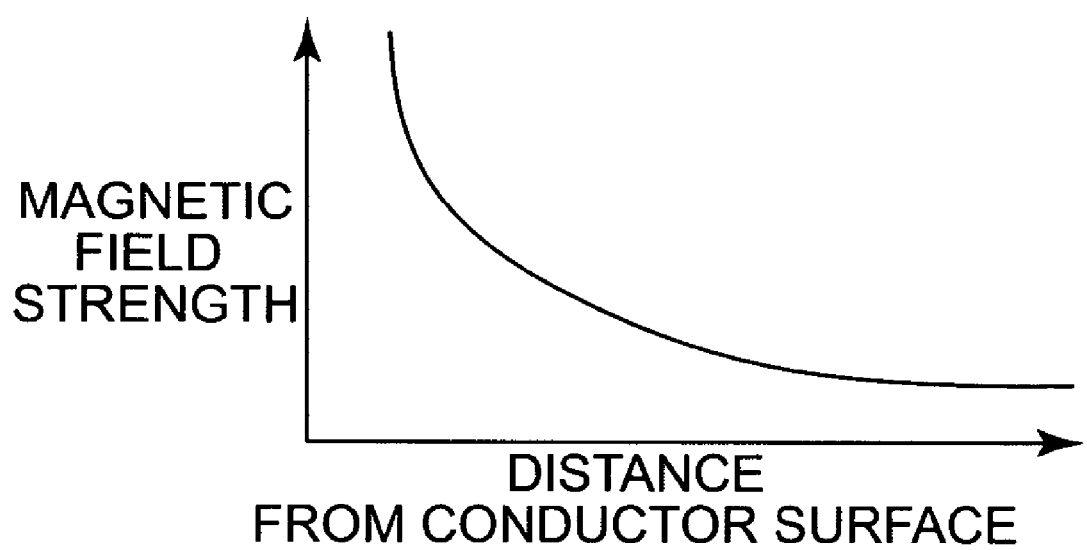
FIG. 5 is a graph illustrating magnetic field strength versus distance from the surface of a conductor originating the magnetic field.

FIG. 5 is a graph illustrating magnetic field strength versus distance from the surface of a conductor originating the magnetic field. Magnetic field strength drops with increasing distance from the surface of bit lines and word lines. Since reference layer lines 58a–c and 158a are configured to carry a sense current, a separate sense conductor is no longer required. By removing the sense conductor from between the reference layer and isolation layer, the word lines are located physically closer to sense layers, such as 72a and 72b, and 172a and 172b. With all else held constant including the write current, the magnetic field strength from a word line is greater at sense layers 72a and 72b, and 172a and 172b. Alternatively, a smaller write current can be used through the word line to generate a magnetic field of sufficient strength to alter the magnetic orientation of sense layers 72a and 72b, and 172a and 172b (i.e., to change or set the state of the memory cell).

What is claimed is:

1. A magnetic memory cell comprising:
   a first line;
   a sense layer in electrical communication with the first line; and
   a reference layer line configured to carry a sense current received from the sense layer, wherein the sense current flows from the first line through the sense layer and away from the memory cell via the reference layer to determine a resistive state of the memory cell.

2. The magnetic memory cell of claim 1, further comprising a barrier layer, where the reference layer line is coupled to the sense layer through the barrier layer.

3. The magnetic memory cell of claim 1, wherein the reference layer functions as a sense conductor to bring a word line closer in proximity to the sense layer.

4. The magnetic memory cell of claim 1, wherein the reference layer line is coupled to the sense layer of more than one memory cell.

5. The magnetic memory cell of claim 1, wherein the sense layer has an alterable magnetic orientation and the reference layer has a pinned magnetic orientation.

6. The magnetic memory cell of claim 1, wherein the reference layer line includes a ferromagnetic film.

7. The magnetic memory cell of claim 6, wherein the ferromagnetic film is selected from the group consisting of NiFe and CoFe.

8. The magnetic memory cell of claim 6, wherein the ferromagnetic film is adjacent an anti-ferromagnetic material.

9. The magnetic memory cell of claim 8, wherein the anti-ferromagnetic material is selected from the group consisting of IrMn, PtMn, CrPtMn and NiMn.

10. The magnetic memory cell of claim 1, wherein the reference layer line comprises at least two layers of ferromagnetic material, each pair of ferromagnetic layers separated by a layer of non-magnetic material.

11. The magnetic memory cell of claim 10, wherein at least one layer of ferromagnetic material is adjacent an anti-ferromagnetic material.

12. The magnetic memory cell of claim 10, wherein the layer of non-magnetic material includes material selected from the group consisting of Ru, Re, Os, Cu and Cr.

13. The magnetic memory cell of claim 1, wherein the reference layer line includes a thin seed layer selected from the group consisting of Ta, Ru, Ta/Ru and Ta/NiFe.

14. The magnetic memory cell of claim 13, wherein the preferred thickness range for the seed layer is 1–10 mm.

15. The magnetic memory cell of claim 1, further comprising a second line insulated from the reference layer line.

16. The magnetic memory cell of claim 15, wherein the first line and the second line are substantially orthogonal to one another.

17. The magnetic memory cell of claim 15, further comprising a third line insulated from the first line, wherein the third line and the second line are substantially orthogonal to one another.

18. A magnetic memory device comprising:
an array of magnetic memory cells;
first lines crossing the array of magnetic memory cells; and
reference layer lines crossing at least one magnetic memory cell in the array of magnetic memory cells wherein the reference layer lines are configured to carry a sense current; and
a read circuit coupled to one of the reference layer lines to provide the sense current through one of the first lines, through a sense layer, and propagated out of a magnetic memory cell through the one of the reference layer lines to determine a magnetic orientation of the magnetic memory cell.

19. The magnetic memory device of claim 18, wherein one reference layer line is coupled to two magnetic memory cells.

20. The magnetic memory device of claim 18, further comprising second lines crossing the array of magnetic memory cells and insulated from the reference layer lines.

21. The magnetic memory device of claim 20, further comprising third lines crossing the array of magnetic memory cells and insulated from the first lines, wherein the third lines and the second lines are substantially orthogonal to one another.

22. A magnetic memory cell comprising:
a first line;
a sense layer in electrical communication with the first line;
a barrier layer;
a reference layer line coupled to the sense layer by the barrier layer;
a second line;
an isolation layer between the second line and the reference layer line;
a third line; and
a second isolation layer between the third line and the first line.

23. The magnetic memory cell of claim 22, further comprising a read circuit electrically coupled to the first line and the reference layer line.

* * * * *